United States Patent
Hsu et al.

(10) Patent No.: US 8,959,466 B1
(45) Date of Patent: Feb. 17, 2015

(54) SYSTEMS AND METHODS FOR DESIGNING LAYOUTS FOR SEMICONDUCTOR DEVICE FABRICATION

(71) Applicant: Taiwan Semiconductor Manufacturing Company Limited, Hsinchu (TW)

(72) Inventors: Chin-Hsiung Hsu, Taoyuan County (TW); Yuan-Te Hou, Hsinchu (TW); Wen-Hao Chen, Hsin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/080,222

(22) Filed: Nov. 14, 2013

(51) Int. Cl.
*G06F 17/50* (2006.01)
(52) U.S. Cl.
CPC ............ *G06F 17/50* (2013.01); *G06F 17/5068* (2013.01)
USPC .............................................. 716/55; 716/122
(58) Field of Classification Search
None
See application file for complete search history.

(56) References Cited

U.S. PATENT DOCUMENTS

| | | | | |
|---|---|---|---|---|
| 7,984,393 B2* | 7/2011 | Aton et al. | ...... | 716/54 |
| 8,601,409 B1* | 12/2013 | Chen et al. | ...... | 716/55 |
| 8,719,737 B1* | 5/2014 | Wang | ...... | 716/52 |
| 8,748,066 B2* | 6/2014 | Chen et al. | ...... | 430/5 |
| 2002/0184606 A1* | 12/2002 | Ohba et al. | ...... | 716/11 |
| 2009/0031261 A1* | 1/2009 | Smith et al. | ...... | 716/2 |
| 2011/0078638 A1* | 3/2011 | Kahng et al. | ...... | 716/52 |
| 2011/0225555 A1* | 9/2011 | Yeric | ...... | 716/55 |
| 2012/0135341 A1* | 5/2012 | Tseng | ...... | 430/5 |
| 2012/0295187 A1* | 11/2012 | Tsai et al. | ...... | 430/5 |
| 2012/0329266 A1* | 12/2012 | Hiramoto et al. | ...... | 438/618 |
| 2013/0328155 A1* | 12/2013 | Konomi | ...... | 257/499 |

* cited by examiner

*Primary Examiner* — Leigh Garbowski
(74) *Attorney, Agent, or Firm* — Jones Day

(57) ABSTRACT

Systems and methods are provided for designing semiconductor device layouts. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

20 Claims, 11 Drawing Sheets

SYSTEMS AND METHODS FOR DESIGNING LAYOUTS FOR SEMICONDUCTOR DEVICE FABRICATION

FIELD

The technology described in this patent document relates generally to semiconductor devices and more particularly to semiconductor device fabrication.

BACKGROUND

Modern semiconductor devices are often fabricated on an integrated-circuit (IC) chip. Generally, software tools may be implemented to design layouts of an IC chip at very small scales. Once a designed layout for an IC chip is finalized, the layout may be converted into a set of masks or reticles using an electron beam, ion beam or other suitable techniques. One or more semiconductor wafers may be patterned during one or more lithography processes using the set of masks so that the mask patterns are transferred to the wafers for fabricating semiconductor devices of the IC chip.

As more devices are incorporated on a single IC chip, the size of each device and the spacing between the devices (i.e., feature size) continues to decrease. For example, the feature size of an IC chip may be much smaller than the wavelength of light used for lithography (e.g., the resolution of the lithography). Multi-patterning lithography is often used to generate sub-resolution features on the IC chip. For example, a sequence of patterning processes, which may correspond to separate lithography exposures (e.g., with different masks) respectively, may be implemented to produce a sub-resolution pattern. Generally, an initial design layout is decomposed into multiple targets subject to certain design rules, and each target may correspond to a single mask. Such decomposition, or mask assignment, is called layout coloring, where different shapes in the initial layout are in different colors with the total number of available colors determined by the number of masks. For example, the initial layout includes shapes A and B and the distance between the shapes A and B is less than a predetermined limit. Accordingly, A and B have to be colored differently. That is, A and B have to be assigned to different masks.

However, a layout finalized based on certain design rules may not be reproduced on a semiconductor wafer for fabricating an IC chip. For example, light may diffuse to cause a sharp corner of a shape in the layout to appear round on the wafer. The shapes in the layout may be adjusted to correct for manufacturing idiosyncrasies and achieve better printability, which is often referred to as retargeting.

SUMMARY

In accordance with the teachings described herein, systems and methods are provided for designing semiconductor device layouts. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

In an embodiment, a method is provided for designing semiconductor device layouts. For example, an initial layout including multiple first target features for fabricating semiconductor devices is provided. One or more spaces in the initial layout are determined for dummy insertion. Width variations of one or more second target features included in the first target features are estimated. One or more dummy features are determined to be inserted into the one or more spaces in the initial layout, and the first target features and the dummy features are assigned to multiple masks. A final layout is generated for fabricating the semiconductor devices.

In another embodiment, a non-transitory computer readable storage medium comprises programming instructions for designing semiconductor device layouts. The programming instructions are configured to cause one or more data processors to execute certain operations. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

In yet another embodiment, a system for designing semiconductor device layouts includes one or more data processors, and a computer-readable storage medium. The computer-readable storage medium is encoded with instructions for commanding the data processors to execute certain operations. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

DETAILED DESCRIPTION

Figure 1:
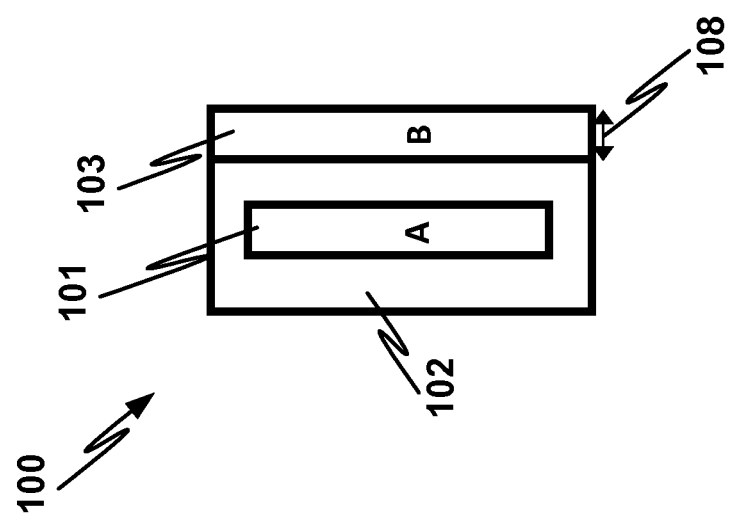
FIG. 1 depicts an example diagram showing width variations of a certain feature on a layout.

Retargeting (i.e., adjusting shapes in a layout) may cause certain issues under some circumstances. As shown in FIG. 1, a feature 101 (e.g., the feature "A") and a feature 103 (e.g., the feature "B") are shown on a layout 100 for an IC chip, representing components of an IC chip or inter-component connections (e.g., metal wires). The features 101 and 103 are colored differently and thus belong to different masks. For example, the feature 101 may be formed earlier than the feature 103 during the fabrication process. The feature 103 may have a width variation problem.

Specifically, a spacer 102 may be formed on a wafer for fabricating the feature 101. The feature 103 may be retargeted to have an extended width. As the spacer 102 for fabricating the feature 101 overlaps with the retargeted feature 103, the fabricated feature 103 may have a final width 108. However, the retargeting may cause a width variation of the feature 103. The fabricated feature 103 may shift to the right, and thus the final width 108 is much larger than the originally designed width. Or, the fabricated feature 103 may shift to the left, and thus the final width 108 may be smaller than the originally designed width, because part of the fabricated feature 103 that falls on the spacer 102 (e.g., the overlapping part) may be removed when the spacer 102 is etched away during the fabrication process. Such a width variation may cause estimation inaccuracy of timing and/or frequency related parameters of the IC chip.

Figure 2:
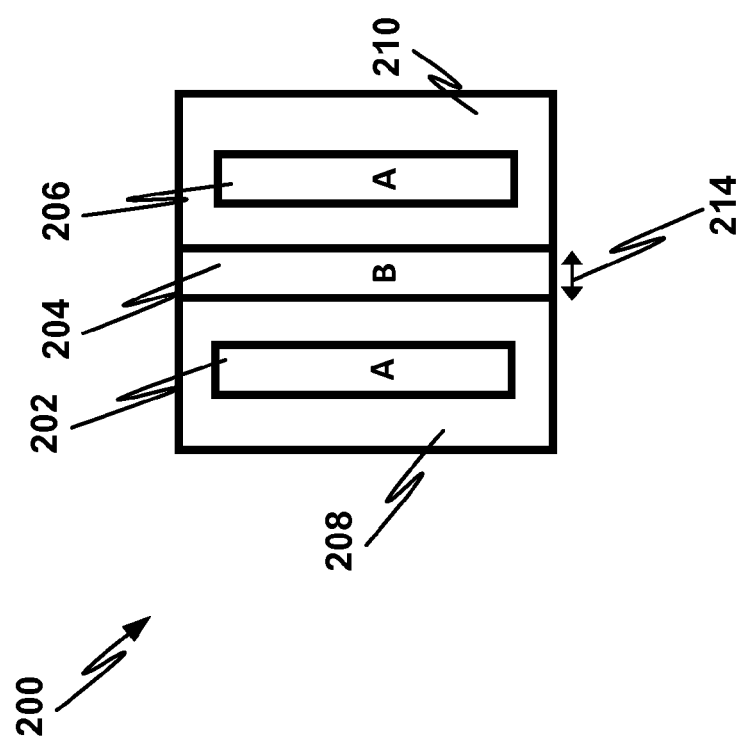
FIG. 2 depicts an example diagram for reducing width variations of a certain feature on a layout.

FIG. 2 depicts an example diagram for reducing width variations of a certain feature on a layout. The layout 200 includes a target feature 202 and another target feature 204 which may represent components of an IC chip or inter-component connections (e.g., metal wires). In addition, the layout 200 includes a dummy feature 206 for reducing width variations of the feature 204.

Specifically, as shown in FIG. 2, the features 202 and 204 in different colors in the layout 200 may belong to different masks. For example, the feature 202 may be formed earlier than the feature 204 in fabrication. The dummy feature 206 may be inserted right next to the feature 204 and may belong to a same mask as the feature 202 (e.g., having a same color). Spacers 208 and 210 may be formed on a wafer for fabricating the features 202 and 206 respectively. The feature 204 may be retargeted to have an extended width. The spacers 208 and 210 may both overlap with the retargeted feature 204, and a distance 214 between the spacers 208 and 210 may be close to the originally designed width of the feature 204 in the layout 200. Thus, even if the fabricated feature 204 shifts to the left or to the right as a result of the retargeting, the final width of the fabricated feature 204 that is approximately equal to the distance 214 is close to the originally designed width.

Figure 3:
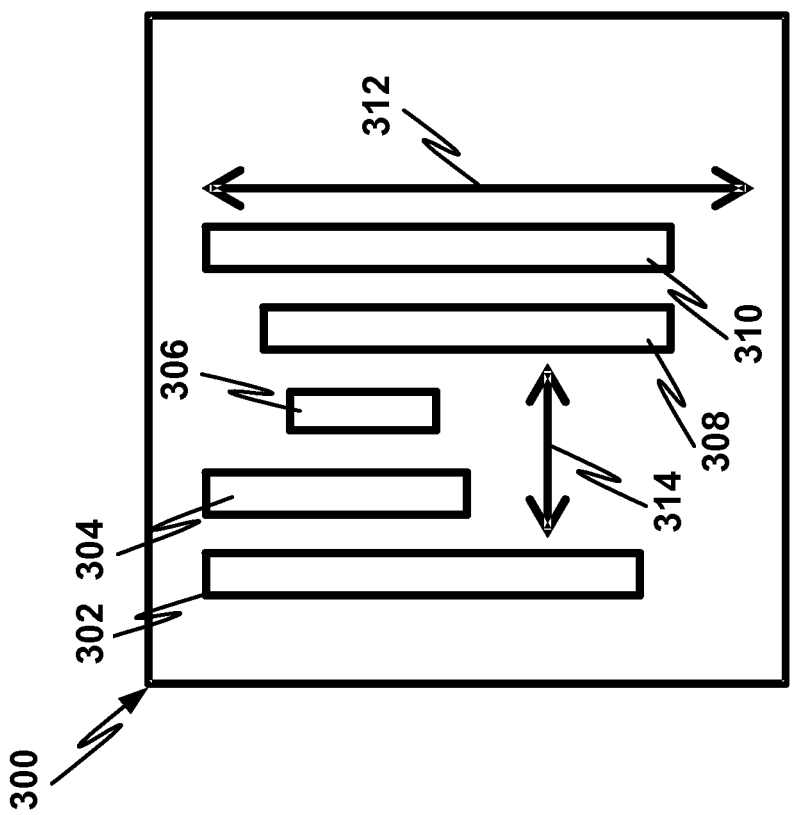
FIG. 3 depicts an example diagram of a layout for an IC chip.

Dummy insertion as shown in FIG. 2 may need to follow certain rules in a layout. FIG. 3 depicts an example diagram of a layout for an IC chip. As shown in FIG. 3, the layout 300 includes features 302, 304, 306, 308 and 310. For example, to add one or more dummy features in the layout 300, certain insertion rules may be followed. As an example, one or more dummy features may be inserted into the right of the feature 310, if a parallel space 312 along the direction of the feature 310 is equal to or larger than thrice a minimum space. If an orthogonal space 314 between the features 302 and 308 is equal to or larger than a sum of a minimum length and twice the minimum space, one or more dummy features may be inserted between the features 302 and 308. In some embodiments, the minimum space may be in a range of about 20 nm to about 100 nm, and the minimum length may be about 200 nm. For example, the distance between the feature 302 and the feature 304, the distance between the feature 304 and the feature 306, the distance between the feature 306 and the feature 308, or the distance between the feature 308 and the feature 310 may be smaller than a predetermined limit (e.g., twice the minimum space).

Figure 4:
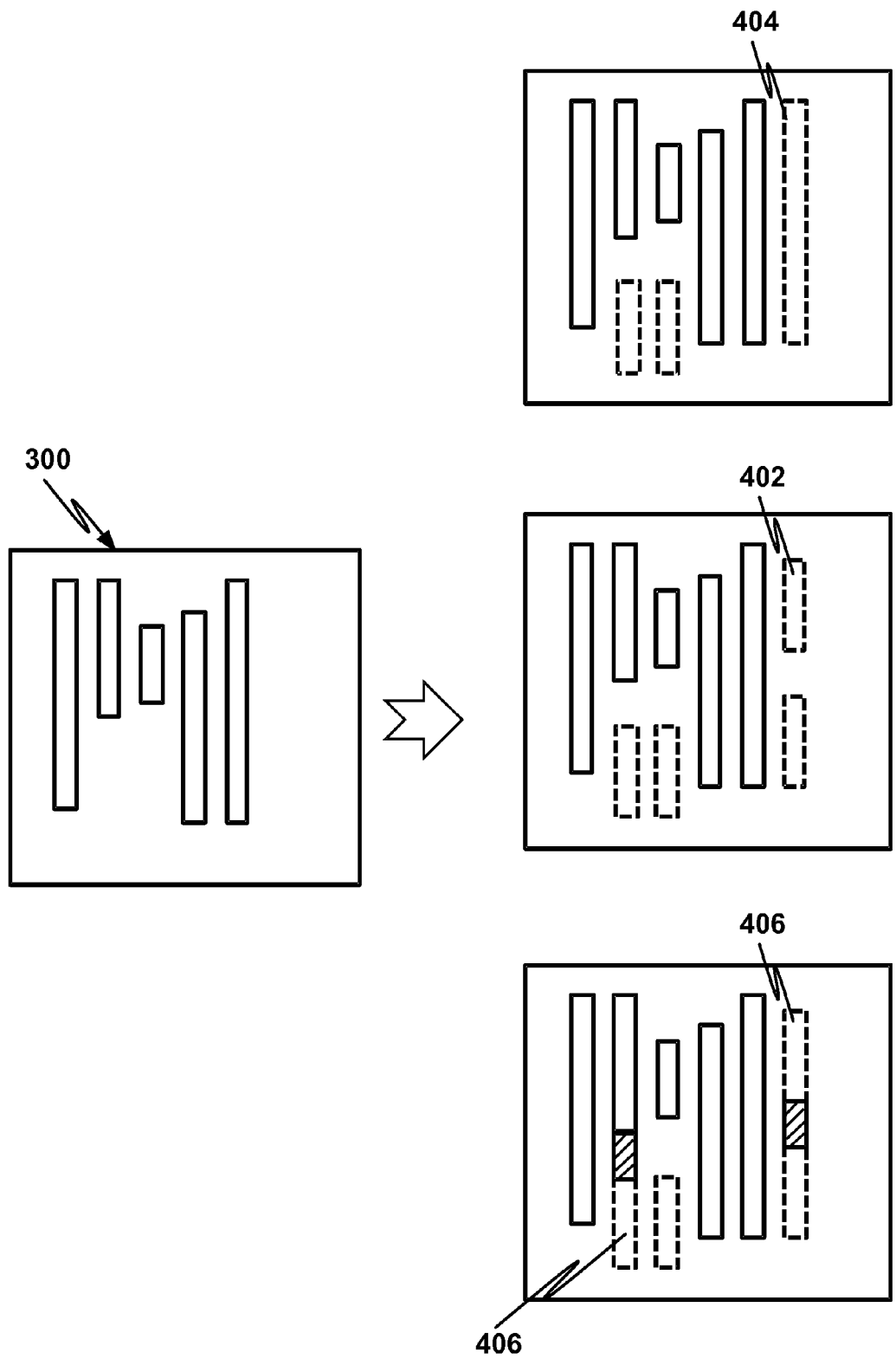
FIG. 4 depicts example diagrams showing different shapes of dummy features to be inserted into a layout.

As shown in FIG. 4, based on the dummy insertion rules, different shapes of dummy features may be selected for insertion in the layout 300, such as piece-wise dummy features (e.g., the dummy feature 402), complete dummy features (e.g., the dummy feature 404), and cut-based dummy features (e.g., the dummy features 406).

Figure 5:
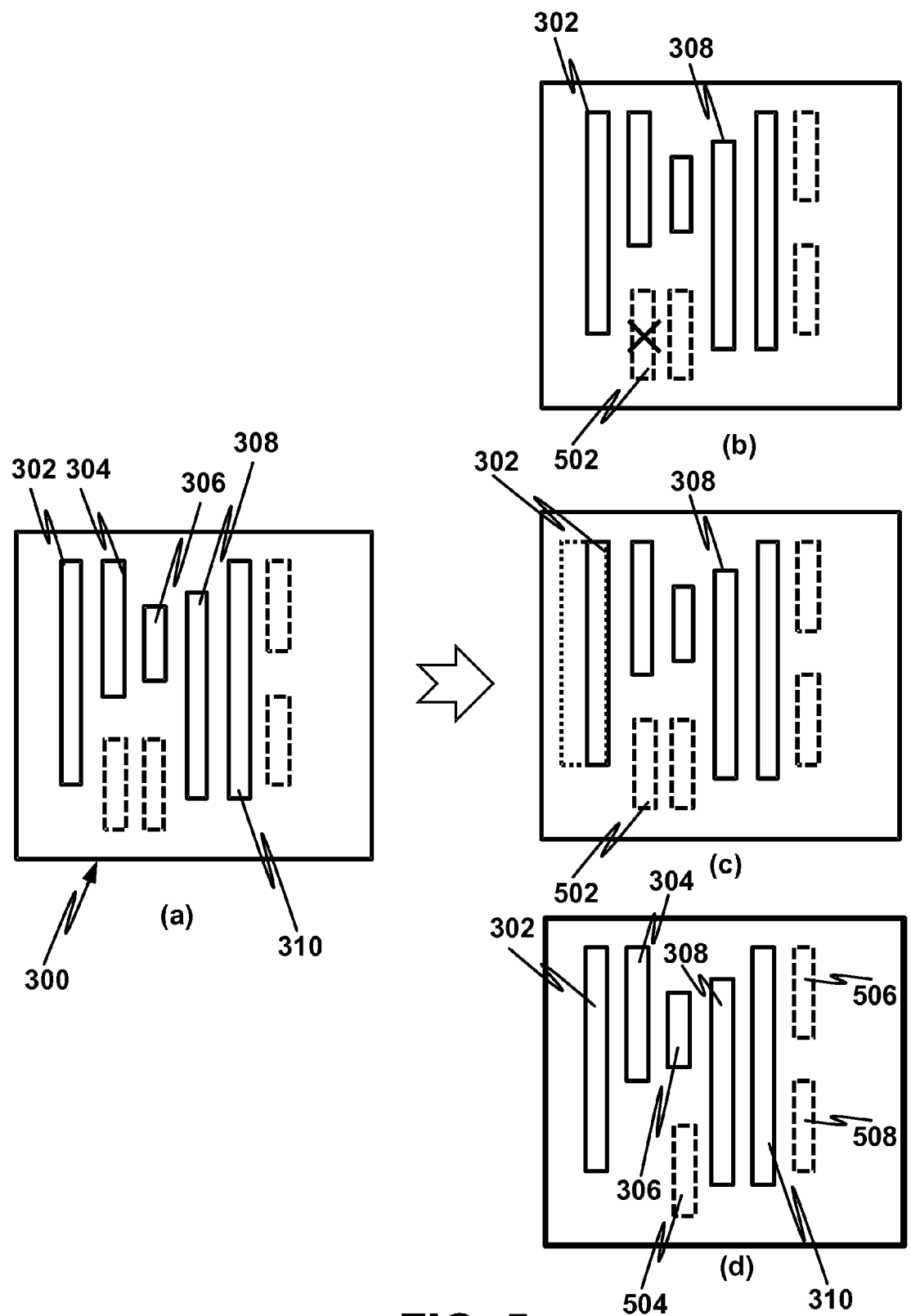
FIGS. 5(a)-5(d) depict example diagrams for determining dummy insertion in combination with layout coloring.

Dummy insertion as shown in FIG. 3 may be combined with layout coloring. FIGS. 5(a)-5(d) depict example diagrams for determining dummy insertion in combination with layout coloring. As shown in FIG. 5(a), a number of dummy features may be selected as candidates to be inserted into the layout 300.

As shown in FIG. 5(b), if the feature 302 is formed earlier (e.g., similar to the feature 202 as shown in FIG. 2) than certain features in the layout 300, the feature 302 may not have a width variation problem and thus a dummy feature right next to the feature 302 may not be needed. In addition, if a dummy feature 502 is inserted right next to the feature 302, the space between the dummy feature 502 and the feature 302 may be smaller than a predetermined limit (e.g., twice the minimum space).

As shown in FIG. 5(c), if the feature 302 is formed later (e.g., similar to the feature 204 as shown in FIG. 2) than some features in the layout 300, the feature 302 may have a width variation problem and thus a dummy feature right next to the feature 302 may be needed. For example, the dummy feature 502 may be inserted into the layout 300 and colored differently from the feature 302. But the feature 302 may still have a width variation problem since the fabricated feature 302 may shift to the left as a result of retargeting.

The features 302, 304, 306, 308 and 310 and the dummy features to be inserted into the layout 300 may be assigned to different masks to reduce width variation problems. As shown in FIG. 5(d), the features 302, 306 and 310 may be colored the same (e.g., similar to the feature 202 as shown in FIG. 2) and may not have width variation problems. On the other hand, the features 304 and 308 are colored the same (e.g., similar to the feature 204 as shown in FIG. 2). For example, the dummy feature 504 may be colored the same as the features 302, 306 and 310, and the dummy features 506, 508 may be colored the same as the features 304 and 308. As shown in FIG. 5(d), the feature 304 may be disposed between the features 302 and 306 and any shifting of the fabricated feature 304 may not cause a width variation problem. Similarly, the feature 308 may be disposed with the feature 306 and the dummy feature 504 on one side and with the feature 310 on the other side. Any shifting of the fabricated feature 308 may not cause a width variation problem either.

Figure 6:
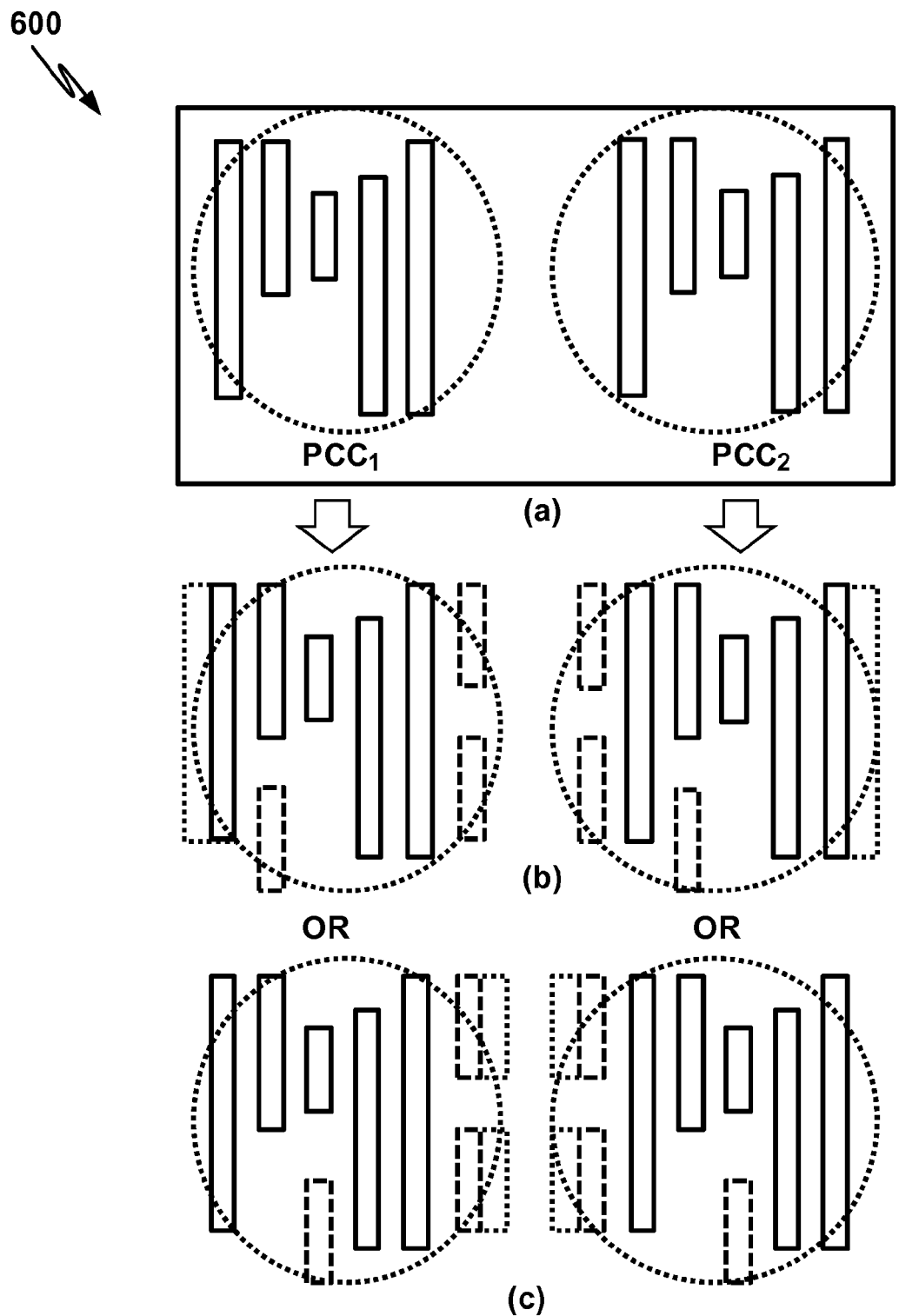
FIG. 6(a)-FIG. 6(c) depict example diagrams for determining dummy insertion and layout coloring.

FIG. 6(a)-FIG. 6(c) depict example diagrams for determining dummy insertion and layout coloring. Dummy insertion and layout coloring may be determined to reduce a cost of the entire layout 600 which is associated with width variations of different features in the layout 600 and dummy features to be inserted into the layout 600.

Specifically, a conflict graph may be constructed, where a node in the conflict graph may represent a feature in the layout 600, and an edge between two nodes may represent a conflict between features. Based on the conflict graph, potentially-connected components (e.g., $PCC_1$ and $PCC_2$) may be built for determining the cost of the layout 600, as shown in FIG. 6(a). Different dummy features may be selected to be inserted into the layout 600 and different layout coloring may be chosen to determine a minimum cost of the layout 600, as shown in FIG. 6(b) and FIG. 6(c). A final layout may be generated based on the dummy features and the layout coloring that yield the minimum cost of the layout 600.

FIG. 7(a)-FIG. 7(c) depict example diagrams for determining dummy insertion and layout coloring. Dummy insertion and layout coloring may be determined to reduce a cost of the entire layout 700 according to estimated width variations of different features in the layout 700 and dummy features to be inserted into the layout 700.

Figure 7:
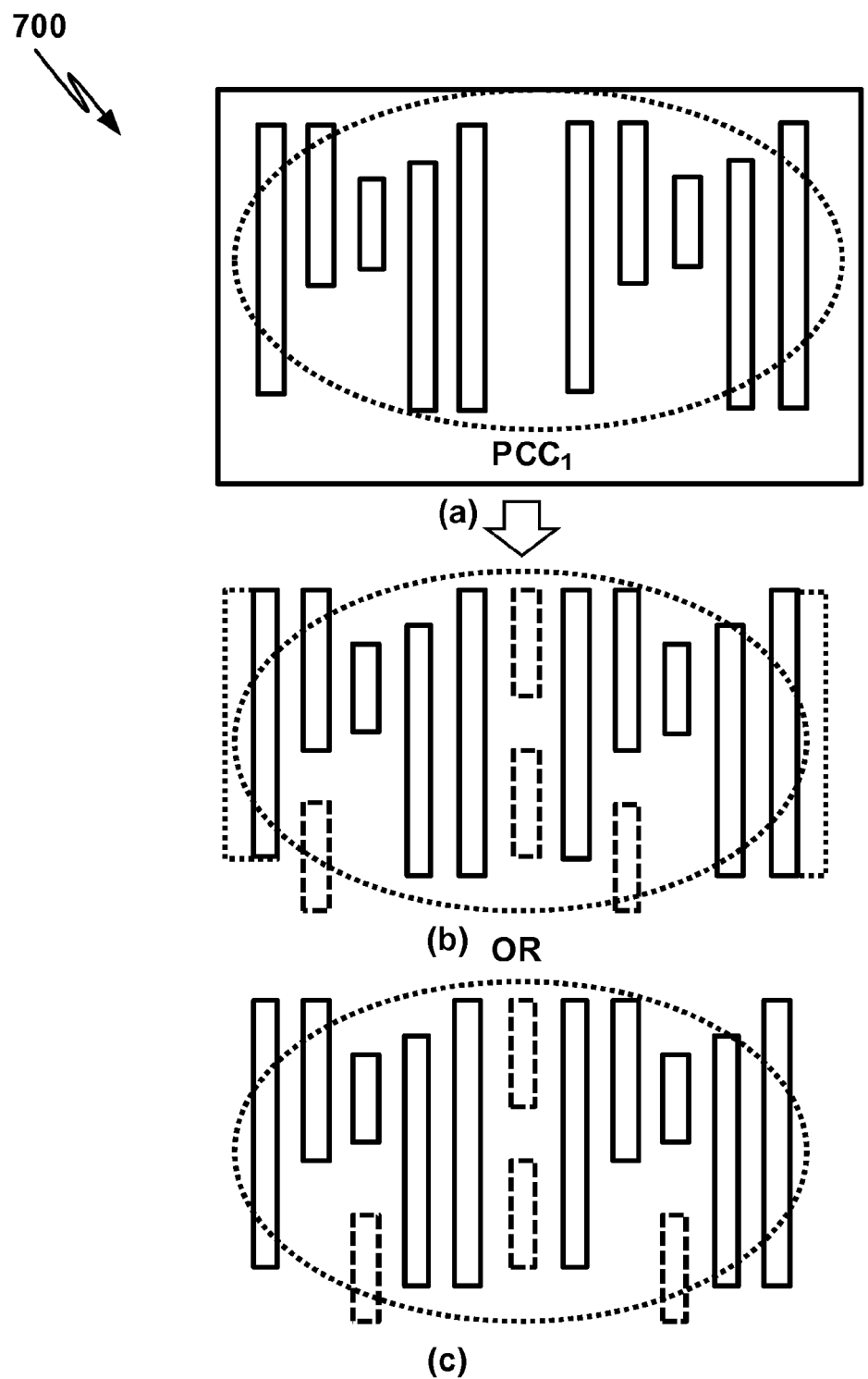
FIG. 7(a)-FIG. 7(c) depict example diagrams for determining dummy insertion and layout coloring.

Specifically, a conflict graph may be constructed for the layout 700. Based on the conflict graph, a potentially-connected component (e.g., $PCC_1$) may be built as shown in FIG. 7(*a*). Different dummy features may be selected to be inserted into the layout 700 and different layout coloring may be chosen to determine a minimum cost of the layout 700, as shown in FIG. 7(*b*) and FIG. 7(*c*). A final layout may be generated based on the dummy features and the layout coloring that yield the minimum cost of the layout 700.

Figure 8:
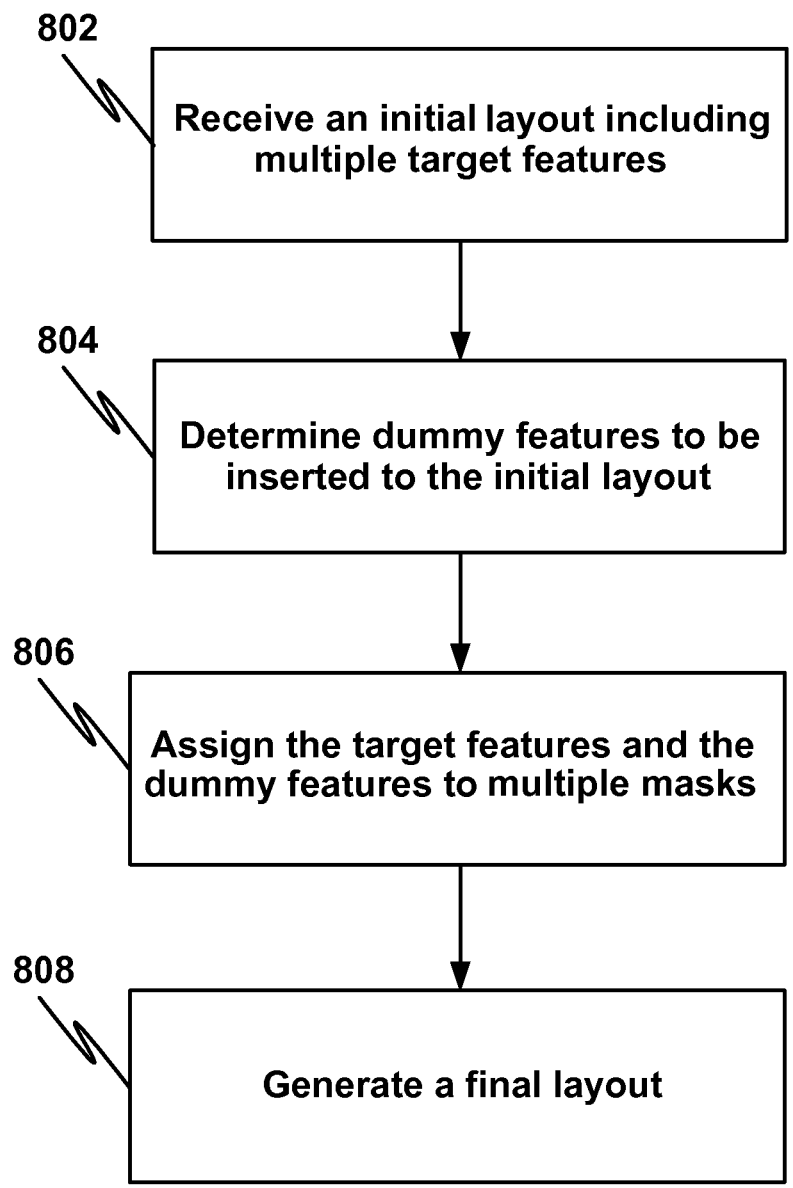
FIG. 8 depicts an example flow chart for designing semiconductor device layouts.

FIG. 8 depicts an example flow chart for designing semiconductor device layouts. At 802, an initial layout including multiple target features may be received for fabricating semiconductor devices. At 804, one or more dummy features may be determined to be inserted into the initial layout. At 806, the target features and the dummy features may be assigned to multiple masks. At 808, a final layout may be generated for fabricating the semiconductor devices.

Figure 9:
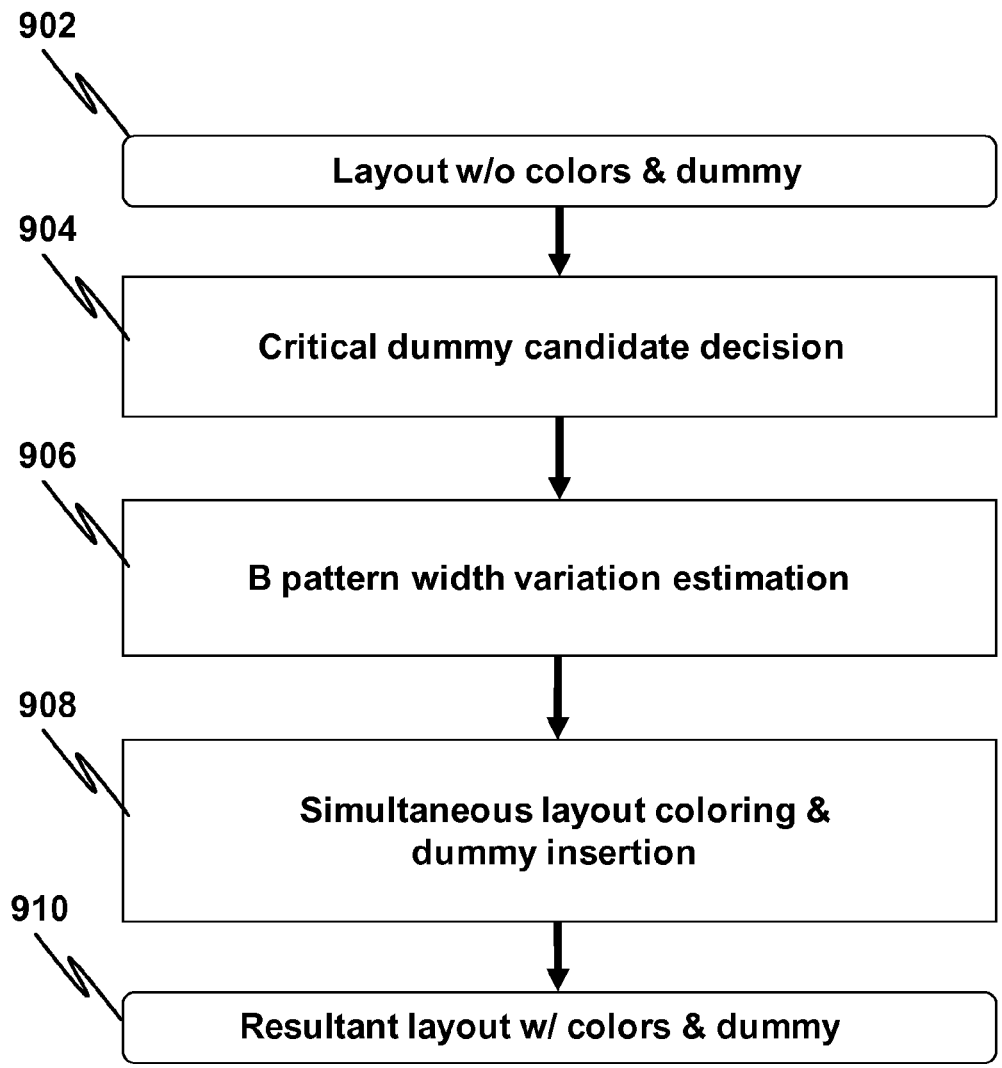
FIG. 9 depicts another example flow chart for designing semiconductor device layouts.

FIG. 9 depicts another example flow chart for designing semiconductor device layouts. At 902, an initial layout without layout coloring or dummy features may be received. At 904, critical dummy candidates may be decided for reducing width variations of target features in the initial layout. For example, one or more spaces in the initial layout may be determined for dummy insertion based on one or more insertion rules. At 906, the width variations associated with certain target features may be estimated. At 908, layout coloring and dummy insertion may be determined (e.g., simultaneously) to reduce the width variations associated with certain target features in the initial layout. At 910, a final layout may be generated with colored features (e.g., belonging to different masks) and inserted dummy features.

Figure 10:
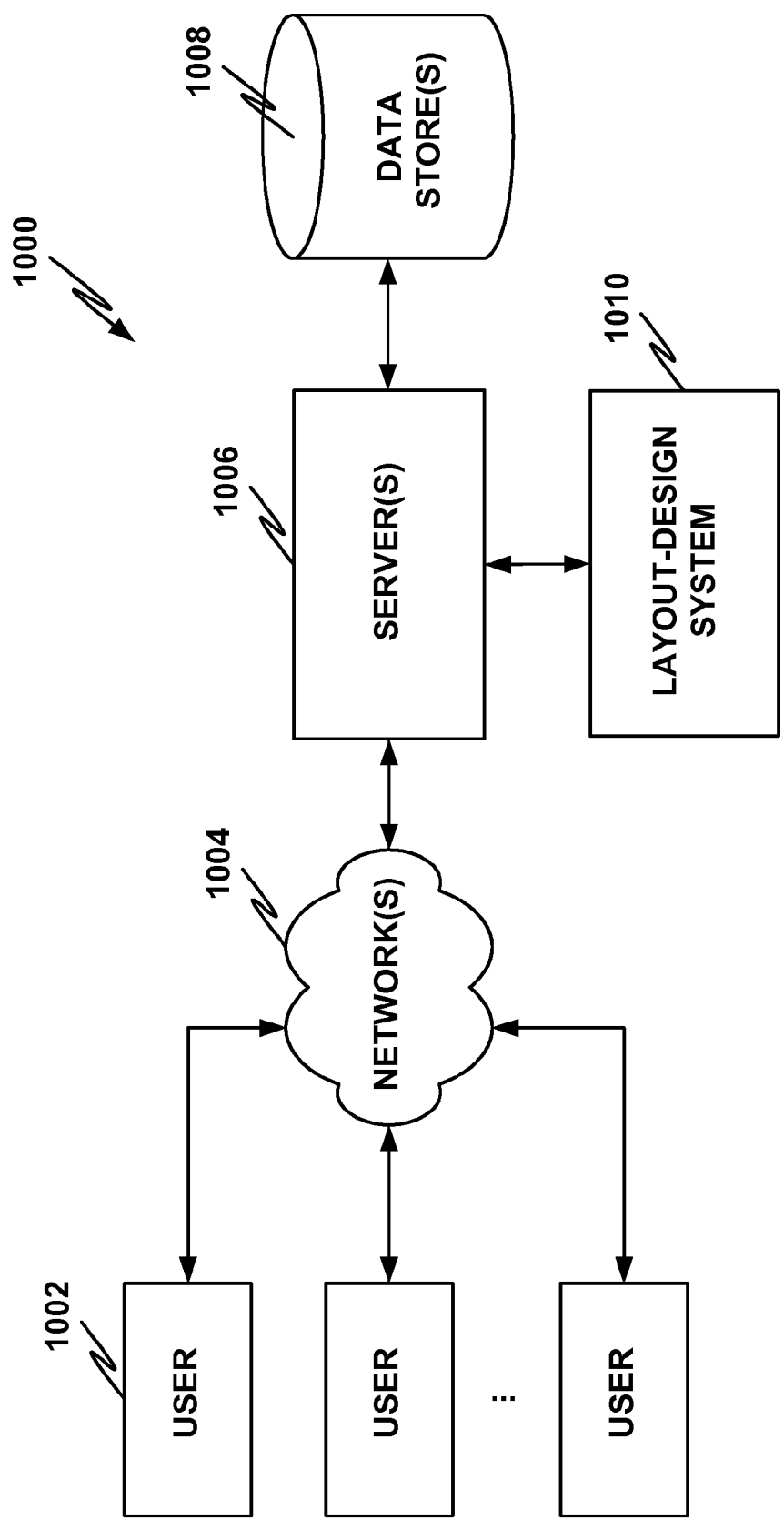
FIG. 10 depicts an example computer-implemented environment wherein users interact with a layout-design system.

FIG. 10 depicts an example computer-implemented environment wherein users 1002 interact with a layout-design system 1010. As shown in FIG. 10, the users 1002 can interact with the layout-design system 1010 through a number of ways, such as over one or more networks 1004. The one or more servers 1006 accessible through the network(s) 1004 can host the layout-design system 1010. The one or more servers 1006 can also contain or have access to one or more data stores 1008 for storing data for the layout-design system 1010.

Figure 11:
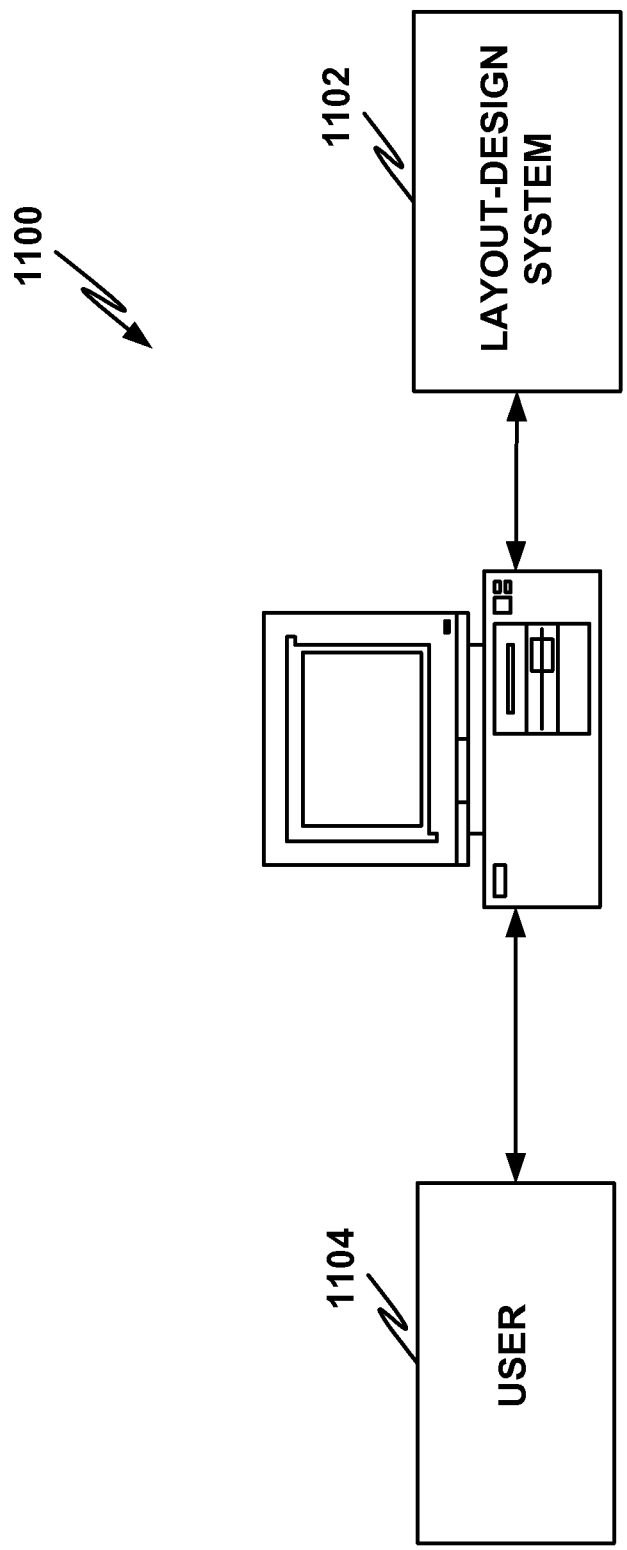
FIG. 11 depicts an example layout-design system provided on a stand-alone computer for access by a user.

The examples used in this disclosure can vary. For example, a computer-implemented system and method can be configured for performing layout design for multiple patterning with multiple spacers, self-aligned multiple patterning, double patterning, or any other lithography processes involving one or more patterning operations. As another example, a computer-implemented system and method can be configured for performing layout design for manufacturing foundries or for electronic design automation (EDA) facilities. As another example, a computer-implemented system and method can be configured such that a layout-design system 1102 can be provided on a stand-alone computer for access by a user 1104, such as shown at 1100 in FIG. 11.

In one embodiment, a method is provided for designing semiconductor device layouts. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

In another embodiment, a method is provided for designing semiconductor device layouts. For example, an initial layout including multiple first target features for fabricating semiconductor devices is provided. One or more spaces in the initial layout are determined for dummy insertion. Width variations of one or more second target features included in the first target features are estimated. One or more dummy features are determined to be inserted into the one or more spaces in the initial layout, and the first target features and the dummy features are assigned to multiple masks. A final layout is generated for fabricating the semiconductor devices.

In yet another embodiment, a non-transitory computer readable storage medium comprises programming instructions for designing semiconductor device layouts. The programming instructions are configured to cause one or more data processors to execute certain operations. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

In yet another embodiment, a system for designing semiconductor device layouts includes one or more data processors, and a computer-readable storage medium. The computer-readable storage medium is encoded with instructions for commanding the data processors to execute certain operations. For example, an initial layout including multiple target features associated with semiconductor devices is received. One or more dummy features are determined to be inserted into the initial layout. The target features and the dummy features are assigned to multiple masks based at least in part on one or more mask-assignment rules. A final layout is generated for fabricating the semiconductor devices.

The above only describes several scenarios presented by this invention, and the description is relatively specific and detailed, yet it cannot therefore be understood as limiting the scope of this invention's patent. It should be noted that ordinary technicians in the field may also, without deviating from the invention's conceptual premises, make a number of variations and modifications, which are all within the scope of this invention. As a result, in terms of protection, the patent claims shall prevail.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope or of what may be claimed, but rather as descriptions of features specific to particular embodiments. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A processor-implemented method for designing semiconductor device layouts, the method comprising:
   receiving an initial layout including multiple first target features for fabricating semiconductor devices, the initial layout being without layout coloring or dummy features;
   determining, using one or more data processors, dummy feature candidates for the initial layout;
   determining first width variations associated with the first target features;
   determining layout coloring and first dummy features simultaneously to reduce the first width variations associated with the first target features, the first dummy features being selected from the dummy feature candidates; and
   generating, using the one or more data processors, a final layout for fabricating the semiconductor devices based at least in part on the layout coloring and the first dummy features.

2. The method of claim 1, wherein
   the dummy feature candidates are determined based at least in part on spaces between the first target features.

3. The method of claim 2, wherein the spaces between the first target features include a parallel space and an orthogonal space.

4. The method of claim 3, wherein:
   the parallel space is determined based on at least information associated with a minimum length and a minimum space; and
   the orthogonal space is determined based on at least information associated with the minimum space.

5. The method of claim 4, wherein:
   a dummy feature candidate is determined if the parallel space is no smaller than a sum of the minimum length and twice the minimum space or the orthogonal space is no smaller than three times the minimum space.

6. The method of claim 1, wherein the first dummy features include one or more selected from a group consisting of: a piece-wise dummy, a complete dummy, and a cut-based dummy.

7. The method of claim 1, wherein determining layout coloring and first dummy features simultaneously to reduce the first width variations associated with the first target features includes:
   selecting a first dummy feature group and a second dummy feature group from the dummy feature candidates;
   determining a first test feature group and a second test group, the first test feature group including the first target features and the first dummy feature group, the second test feature group including the first target features and the second dummy feature group;
   assigning the first test feature group to masks;
   determining a first cost corresponding to the assignment of the first test feature group to the masks;
   assigning the second test feature group to the masks;
   determining a second cost corresponding to the assignment of the second feature group to the masks;
   comparing the first cost and the second cost;
   in response to the first cost being smaller than the second cost, determining that the layout coloring corresponds to the assignment of the first test feature group to the masks and the first dummy feature group includes the first dummy features; and
   in response to the first cost being no smaller than the second cost, determining that the layout coloring corresponds to the assignment of the second test feature group to the masks and the second dummy feature group includes the first dummy features.

8. The method of claim 7, wherein assigning the first test feature group to masks includes:
   determining one or more third target features to be assigned to a first mask, the one or more third target features being included in the first target features;
   determining one or more third dummy features to be assigned to a second mask, the one or more third dummy features being included in the first dummy feature group;
   estimating one or more second width variations associated with the one or more third target features; wherein the first cost is determined based at least in part on the one or more second width variations.

9. The method of claim 7, wherein assigning the second test feature group to masks includes:
   determining one or more third target features to be assigned to a first mask, the one or more third target features being included in the first target features;
   determining one or more third dummy features to be assigned to a second mask, the one or more third dummy features being included in the second dummy feature group; and
   estimating one or more second width variations associated with the one or more third target features; wherein the second cost is determined based at least in part on the one or more second width variations.

10. The method of claim 1, wherein determining layout coloring and first dummy features simultaneously to reduce the first width variations associated with the first target features includes:
   selecting a plurality of dummy feature groups from the dummy feature candidates;
   determining a plurality of test feature groups, a test feature group including the first target features and a dummy feature group;
   assigning the plurality of test feature groups to masks;
   determining a plurality of costs corresponding to the assignments of the plurality of test feature groups to the masks; and
   determining a minimum of the plurality of costs for determining the layout coloring and the first dummy features.

11. The method of claim 10, wherein assigning the plurality of test feature groups to masks includes: assigning each test feature group to the masks.

12. The method of claim 10, wherein determining a plurality of costs corresponding to the assignments of the plurality of test feature groups to the masks includes:
   determining a cost for the assignment of each test feature group to the masks.

13. The method of claim 10, wherein the minimum corresponding to a first assignment of a first test feature group to the masks;
   the layout coloring corresponds to the first assignment of the first test feature group to the masks; and
   the first dummy features are included in the first test feature group.

14. The method of claim 1, wherein determining layout coloring and first dummy features simultaneously to reduce the first width variations associated with the first target features includes:
   constructing a conflict graph based at least in part on the first target features;
   building one or more potentially connected components based on the first target features and the dummy feature candidates; and
   assigning the first target features and the dummy feature candidates to masks to reduce a cost associated with the one or more potentially connected components.

15. The method of claim 1, wherein the final layout includes one or more second target features being assigned to a first mask and one or more third target features being assigned to a second mask;
   wherein the one or more second target features and the one or more third target features are included in the first target features.

16. The method of claim 15, wherein the final layout includes one or more second dummy features being assigned to the first mask to reduce one or more second width variations associated with the one or more third target features, the one or more second width variations being related to a retargeting process.

17. A non-transitory computer readable storage medium comprising programming instructions for designing semiconductor device layouts, the programming instructions configured to cause one or more data processors to execute operations comprising:
   receiving an initial layout including multiple first target features associated with semiconductor devices;
   determining dummy feature candidates for the initial layout;
   determining first width variations associated with the first target features;
   determining layout coloring and first dummy features simultaneously to reduce the first width variations associated with the first target features, the first dummy features being selected from the dummy feature candidates; and
   generating a final layout for fabricating the semiconductor devices based at least in part on the layout coloring and the first dummy features.

18. A system for designing semiconductor device layouts, said system comprising:
   one or more data processors; and
   a computer-readable storage medium encoded with instructions for commanding the data processors to execute operations including:
      receiving an initial layout including multiple first target features associated with semiconductor devices, the initial layout being without layout coloring or dummy features;
      determining dummy feature candidates for the initial layout;
      determining first width variations associated with the first target features;
      determining layout coloring and first dummy features to reduce the first width variations associated with the first target features, the first dummy features being selected from the dummy feature candidates; and
      generating a final layout for fabricating the semiconductor devices based at least in part on the layout coloring and the first dummy features.

19. The system of claim 18, wherein determining layout coloring and first dummy features simultaneously to reduce the first width variations associated with the first target features includes:
   selecting a first dummy feature group and a second dummy feature group from the dummy feature candidates;
   determining a first test feature group and a second test group, the first test feature group including the first target features and the first dummy feature group, the second test feature group including the first target features and the second dummy feature group;

assigning the first test feature group to masks;

determining a first cost corresponding to the assignment of the first test feature group to the masks;

assigning the second test feature group to the masks;

determining a second cost corresponding to the assignment of the second feature group to the masks;

comparing the first cost and the second cost;

in response to the first cost being smaller than the second cost, determining that the layout coloring corresponds to the assignment of the first test feature group to the masks and the first dummy feature group includes the first dummy features; and in response to the first cost being no smaller than the second cost, determining that the layout coloring corresponds to the assignment of the second test feature group to the masks and the second dummy feature group includes the first dummy features.

20. The system of claim 18, wherein determining layout coloring and first dummy features simultaneously to reduce the first width variations associated with the first target features includes:

selecting a plurality of dummy feature groups from the dummy feature candidates;

determining a plurality of test feature groups, a test feature group including the first target features and a dummy feature group;

assigning the plurality of test feature groups to masks;

determining a plurality of costs corresponding to the assignments of the plurality of test feature groups to the masks; and determining a minimum of the plurality of costs for determining the layout coloring and the first dummy features.

* * * * *